United States Patent
Sestok, IV

(10) Patent No.: US 10,551,469 B2
(45) Date of Patent: Feb. 4, 2020

(54) CALIBRATION OF INVERTING AMPLIFIER BASED IMPEDANCE ANALYZERS

(71) Applicant: TEXAS INSTRUMENTS INCORPORATED, Dallas, TX (US)

(72) Inventor: Charles Kasimer Sestok, IV, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/445,762

(22) Filed: Feb. 28, 2017

(65) Prior Publication Data

US 2017/0254871 A1  Sep. 7, 2017

Related U.S. Application Data

(60) Provisional application No. 62/301,818, filed on Mar. 1, 2016.

(51) Int. Cl.
*G01R 35/00* (2006.01)
*G01R 27/02* (2006.01)

(52) U.S. Cl.
CPC .................. *G01R 35/005* (2013.01)

(58) Field of Classification Search
CPC ................ G01R 35/005; G01R 27/02
See application file for complete search history.

(56) References Cited

U.S. PATENT DOCUMENTS

| 4,041,382 A * | 8/1977 | Washburn ........... G01K 7/24 324/130 |
|---|---|---|
| 5,297,425 A | 3/1994 | Hamby et al. |
| 8,604,809 B2 | 12/2013 | Eilersen |
| 2001/0010467 A1 | 8/2001 | Oguma et al. |
| 2005/0072874 A1 | 4/2005 | Denen et al. |
| 2006/0182231 A1 | 8/2006 | Tan et al. |
| 2007/0268012 A1 | 11/2007 | Kawabata |
| 2008/0303538 A1* | 12/2008 | Orr ............... G01R 15/005 324/707 |
| 2011/0074392 A1 | 3/2011 | Bartlett et al. |
| 2011/0115509 A1 | 5/2011 | Kim et al. |
| 2011/0227587 A1 | 9/2011 | Nakanishi et al. |
| 2014/0145729 A1 | 5/2014 | Sobolewski |

(Continued)

OTHER PUBLICATIONS

Chen, Chiouguey J., "Modified Goertzel Algorithm in DTMF Detection Using the TMS320C80," Texas Instruments Application Report, SPRA066, Jun. 1996 (19 pages).

(Continued)

*Primary Examiner* — Akm Zakaria
(74) *Attorney, Agent, or Firm* — Michael A. Davis, Jr.; Charles A. Brill; Frank D. Cimino

(57) ABSTRACT

A circuit for measuring an impedance of a device under test (DUT). The circuit includes: (i) circuitry for generating a stimulus wave at a stimulus frequency; (ii) an amplifier circuit coupled to the DUT to present a response signal from the DUT in response to the stimulus wave; (iii) switching circuitry for selectively coupling, between the stimulus wave and an input to the amplifier, either the DUT, a first calibration impedance, or a second calibration impedance. With the switching functionality, calibrations are performed so to provide a measure of impedance of the DUT in response to the plural calibrations.

18 Claims, 3 Drawing Sheets

(56) References Cited

U.S. PATENT DOCUMENTS

2016/0077140 A1  3/2016 Todi et al.
2016/0274060 A1* 9/2016 Denenberg ......... G01N 27/9046

OTHER PUBLICATIONS

Mock, Pat, "Add DTMF Generation and Decoding to DSP-uP Designs," Texas Instruments Application Report, SPRA168, copyright 1997 (19 pages).
CDCE(L)913: Flexible Low Power LVCMOS Clock Generator with SSC Support for EMI Reduction, Texas Instruments datasheet dated Jun. 2007, revised Oct. 2016; located at http://www.ti.com/lit.ds.symlink/cdce913.pdf (35 pages).

* cited by examiner

CALIBRATION OF INVERTING AMPLIFIER BASED IMPEDANCE ANALYZERS

CROSS-REFERENCES TO RELATED APPLICATIONS

This application claims priority, under 35 U.S.C. § 119(e), of Provisional Application No. 62/301,818 filed Mar. 1, 2016 and incorporated herein by this reference.

This application is related to U.S. patent application Ser. No. 15/344,565, entitled "Impedance Analyzer Using Square Wave Stimuli," filed Nov. 6, 2016, which is hereby incorporated herein by this reference.

STATEMENT REGARDING FEDERALLY SPONSORED RESEARCH OR DEVELOPMENT

Not Applicable.

BACKGROUND OF THE INVENTION

The preferred embodiments relate to electronic measurement and are more specifically directed to devices and methods of calibrating to compensate for non-idealities so as to better measure impedance of a circuit element.

As fundamental in the art, the electrical impedance of an electrical circuit or circuit component is the opposition to current that the circuit or component presents to an applied voltage. In general, impedance is a complex quantity, namely the sum of a resistance and a reactance, and varies with the frequency of the applied voltage. Impedance is of course an important factor in the manufacture of electronic circuits and systems, especially in determining the efficiency with which energy is delivered to the load of a circuit. In addition, impedance measurement and analysis can be used in electronic sensors, for example in determining the properties of a material or workpiece, or conditions of the surrounding environment.

Conventional impedance analyzers operate by applying a sinusoidal stimulus to the object under measurement (referred to herein as the "device under test," or "DUT"), and measuring the electrical response of the DUT to that sinusoid waveform. Typically, the response is measured at more than one frequency of the sinusoidal stimulus, for example over a "sweep" of input frequencies. The use of a single frequency sinusoid as the measurement stimulus at each of the frequencies of interest greatly simplifies the measurements, as harmonic interference in the response of the DUT is largely avoided.

Many modern electronic integrated circuits integrate essentially all necessary functional components of a computer system, whether general purpose or arranged for a particular end application. Those large scale integrated circuits that include the computational capability for controlling and managing a wide range of functions and useful applications are often referred to as a microcontroller, or in some implementations as a "system on a chip", or "SoC", device. Typical modern microcontroller architectures include one or more processor cores that carry out the digital computer functions of retrieving executable instructions from memory, performing arithmetic and logical operations on digital data retrieved from memory, and storing the results of those operations in memory. Other digital, analog, mixed-signal, or even RF functions may also be integrated into the same integrated circuit for acquiring and outputting the data processed by the processor cores.

The efficiencies provided by microcontrollers and SoCs have reduced the cost of implementing complex measurement and computational functions in applications for which such functionality had been cost-prohibitive. For example, sensors and controllers are now being deployed in a wide range of applications and environments, including in the widely-distributed networks of such sensors and controllers often referred to as the "Internet of Things" (IoT). For these reasons, microcontroller-based sensors for the measurement and analysis of electrical impedance is attractive. However, as detailed below, such sensors may be vulnerable to inaccurate measures, for example at higher frequencies and/or with the inclusion of a lower cost operational amplifier as part of the sensor, where such attributes provide non-idealities which therefore can affect measurement performance.

By way of further background, FIG. 1 illustrates a conventional microcontroller-based impedance analyzer 10. In this example, analyzer 10 includes a microcontroller 12, which includes a digital frequency synthesizer 14. Synthesizer 14 generates a sample stream corresponding to a desired signal waveform indicated by signals from a processor 16. In this example, this sample stream corresponds to a sinusoidal waveform of a selected frequency. The sample stream generated by digital frequency synthesizer 14 is applied to a digital-to-analog converter (DAC) 18, which is also realized within microcontroller 12, and that generates the output sinusoidal stimulus $V_{in}$ that will be applied to a device under test (DUT) 22 for measurement of its impedance. DUT 22 is a two-terminal device, having one terminal receiving stimulus voltage $V_{in}$ (after additional filtering, if desired), and its other terminal coupled, via a switch $30_{S1}$ discussed below, to the inverting input (−) of an operational amplifier (op amp) 24. Op amp 24 receives a reference voltage 26, for example at ½ the peak-to-peak amplitude of stimulus voltage $V_{in}$, at its non-inverting input (+). A reference impedance 28 is connected in negative feedback fashion between the output of op amp 24 and its inverting input. The output voltage $V_{out}$ from op amp 24 is received by microcontroller 12, and converted to the digital domain by an analog-to-digital converter (ADC) 20.

In this conventional inverting amplifier arrangement, the ratio of output voltage $V_{out}$ to stimulus voltage $V_{in}$ reflects the impedance of DUT 22, relative to the impedance $Z_{REF}$ of reference impedance 28. Ideally, op amp 24 maintains a virtual ground at its inverting input, and with the ideal expectation that the voltage drop across DUT 22 will equal the input voltage $V_{in}$. Additionally and also ideally, assuming the input of op amp 24 exhibits a significantly higher impedance than $Z_{REF}$ of reference impedance 28, effectively all of the current conducted through DUT 22 will pass through reference impedance 28. Output voltage $V_{out}$ will thus be proportional to this DUT current conducted through reference impedance 28. For example, if the impedance of DUT 22 exactly matches $Z_{REF}$ of reference impedance 28, output voltage $V_{out}$ will match stimulus voltage $V_{in}$ (i.e., because the same amount of current through two like impedances will provide the same voltage across each). Accordingly, the impedance of DUT 22 can be determined from the output voltage $V_{out}$ presented by op amp 24, based on the ratio of voltage $V_{out}$ relative to voltage $V_{in}$. As mentioned above, this measurement is performed over frequency by the conventional architecture of FIG. 1, typically by processor 16 controlling digital frequency synthesizer 14 to sweep the frequency of the stimulus voltage $V_{in}$ applied to DUT 22. ADC 20 samples and digitizes output voltage $V_{out}$ representing the response of DUT 22 to the stimulus at each frequency, and processor 16 analyzes that sample stream, for example via a discrete Fourier transform (DFT), to determine the impedance of DUT 22 at each frequency in the sweep. Both the amplitude and phase of output voltage $V_{out}$ relative to stimulus voltage $V_{in}$ are considered in quantifying the inductive and capacitive components of the impedance of DUT 22.

As also shown in the conventional arrangement of FIG. 1, DUT 22 is connected, via a first switch $30_{S1}$ of a switching block 30, to the inverting input of op amp 24. Switching block 30 includes a second switch $30_{S2}$, which is operable to connect a calibration impedance 32 between the input signal $V_{in}$ and the non-inverting input of op amp 24. Thus, switches 30 are operated to select one of two loads at a time as an input to the non-inverting input of op amp 24, whereby, therefore, in one instance calibration impedance 32 may be so selected, so as to perform a calibration operation given that calibration impedance 32 is a known precision impedance that is useful in calibrating the impedance measurement given a lack of precision of reference impedance 28. Specifically, calibration impedance 32 may be a variable impedance device (e.g., a bank of selectable precision resistors) to provide accurate calibration over a wide range of impedances. Thus, by switch $30_{S2}$ selecting the known impedance of $Z_{CAL}$ into the analyzer loop (while DUT 22 is switched out of the loop by switch $30_{S1}$), then a ratio is determinable of $V_{out}$ relative to voltage $V_{in}$, which because $Z_{CAL}$ is known can provide a corresponding value of $Z_{REF}$. Thus, once the reference impedance 28 is estimated from this calibration, thereafter DUT 22 is instead selected as the circuit load (i.e., switch $30_{S1}$ is closed, while switch $30_{S2}$ is opened), and the result of the calibration can be used to adjust the impedance estimation of DUT 22.

While the above-described conventional architecture is capable of analyzing a wide range of load impedances, the accuracy of those measures is based in considerable part on whether op amp 24 is able to maintain a virtual ground, because under that ideal condition the current remains the same through DUT 22 and reference impedance 28. However, the idealities of the op amp 24, and its ability to maintain a virtual ground, are likely to be affected at higher frequencies, such as beyond 100 KHz. Thus, beyond such frequencies, the ability of some op amps to maintain a virtual ground will diminish, as will the consistency of the idealities that are assumed in the modeling of the circuit that are based on ideal operation. For example, also with increasing frequency, the open loop gain that is typically assumed to be infinite can actually diminish significantly. Other ideal attributes of op amp 24 also can change, such as the infinite or very high input impedance can drop, and the relatively low output impedance can rise. One manner of attempting to address these factors is to implement a more expensive op amp, but such an approach may be cost prohibitive and also may still be somewhat vulnerable to these changes, again therefore diminishing the accuracy of DUT impedance measure that arises from the analyzer 10 which is relying on the op amp.

Given the preceding, while the prior art approaches have served various needs, the present inventor seeks to improve upon the prior art, as further detailed below.

BRIEF SUMMARY OF THE INVENTION

In a preferred embodiment, there a circuit for measuring an impedance of a device under test (DUT). The circuit comprises: (i) circuitry for generating a stimulus wave at a stimulus frequency; (ii) an amplifier circuit coupled to the DUT to present a response signal from the DUT in response to the stimulus wave; (iii) switching circuitry for selectively coupling, between the stimulus wave and an input to the amplifier, either the DUT, a first calibration impedance, or a second calibration impedance; and (iv) processor circuitry programmed to sample a signal responsive to the response signal. The processor is programmed to: (A) in a first iteration, with the switching circuitry selectively coupling the first calibration impedance between the stimulus wave and an input to the amplifier, sampling a first signal responsive to the response signal; (B) in a second iteration, with the switching circuitry selectively coupling the second calibration impedance between the stimulus wave and an input to the amplifier, sampling a second signal responsive to the response signal; and (C) in a third iteration, with the switching circuitry selectively coupling the DUT between the stimulus wave and an input to the amplifier, sampling a third signal responsive to the response signal. The processor circuitry is further programmed to provide a measure of impedance of the DUT in response to the first signal responsive to the response signal, the second signal responsive to the response signal, and the third signal responsive to the response signal.

Numerous other inventive aspects are also disclosed and claimed.

DETAILED DESCRIPTION OF EMBODIMENTS

Figure 1:
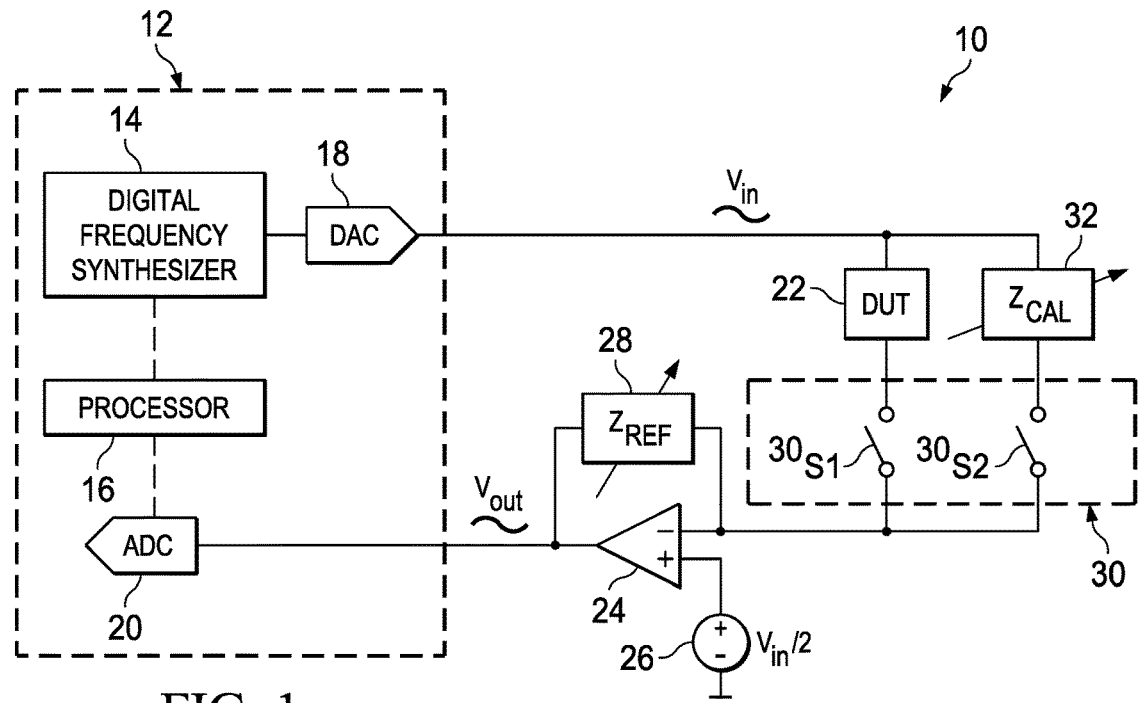
FIG. 1 illustrates an electrical diagram, in block form, of a prior art microcontroller-based impedance analyzer.

FIG. 1 was discussed in the Background Of The Invention section of this document and the reader is assumed familiar with the aspects of that discussion.

Also by way of introduction, one or more preferred embodiments are described in this specification as implemented into a microcontroller or other large scale integrated circuit, as it is contemplated that the implementation of these embodiments will be particularly advantageous in such contexts. However, it is also contemplated that preferred embodiment concepts may be beneficially applied to other applications that carry out the measurement or analysis of an electrical impedance. Accordingly, it is to be understood that the following description is provided by way of example only, and is not intended to limit the true inventive scope as claimed.

Figure 2:
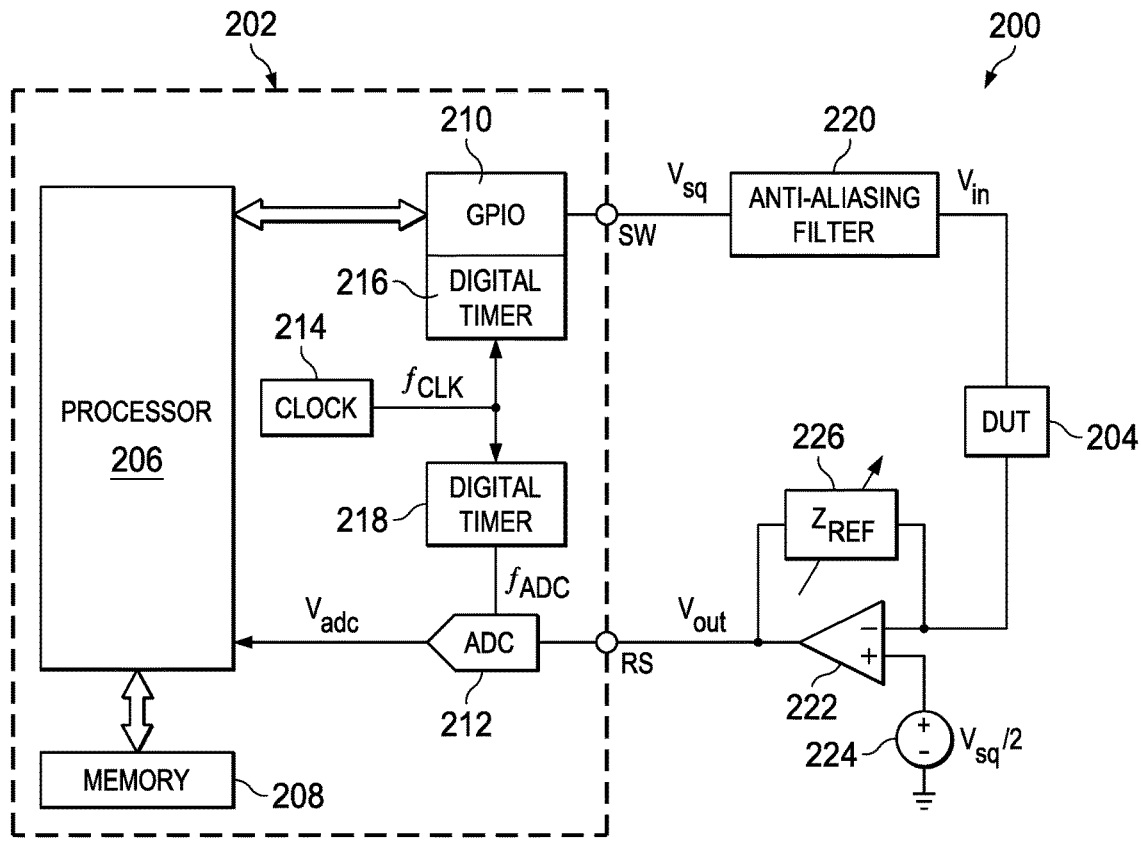
FIG. 2 illustrates, in part, a microcontroller-based impedance analyzer 200 constructed according to a preferred embodiment, where as detailed later additional calibration aspects are added thereto.

FIG. 2 illustrates, in part, a microcontroller-based impedance analyzer 200 constructed according to a preferred embodiment, where as detailed later additional calibration aspects are added thereto, but for purposes of introducing various aspects recognized by the present inventor, it is shown first without such calibration aspects—moreover, FIG. 2 in many respects is the same as FIG. 2 in the above-incorporated U.S. patent application Ser. No. 15/344,565, entitled "Impedance Analyzer Using Square Wave Stimuli," which has the same inventor as the present application, claims priority to the same date as the present application, and is commonly-assigned. Thus, various aspects are stated here, with additional detail available in the incorporated U.S. patent application Ser. No. 15/344,565.

Impedance analyzer 200 may be implemented into a stand-alone sensor (e.g., in the IoT context) or within a larger-scale system or equipment. In a preferred embodiment implementation, analyzer 200 includes a microcontroller 202, which includes the appropriate functional circuitry for generating a stimulus waveform to be applied to a device under test (DUT) 204, and for analyzing the response of that device to the stimulus in order to determine its electrical impedance. In this regard, microcontroller 202 includes one or more processors 206 (also referred to as "processor cores") that are capable of executing program instructions for carrying out the operations described in this specification. Memory resource 208 in FIG. 2 represents the memory capacity of microcontroller 202, and as such may include memory blocks of various types, including non-volatile memory (e.g., "flash" or other electrically programmable memory) storing program instructions and configuration data for processor 206 and other functions in microcontroller 202, and also volatile (e.g., dynamic or static RAM) memory for storing data involved in those operations. Some of memory resource 208 may be embedded within processor(s) 206. Examples of microcontroller devices that are suitable for implementation as microcontroller 202 according to these embodiments include the MSP and C2000x families of microcontrollers available from Texas Instruments Incorporated.

In a preferred embodiment, microcontroller 202 includes a general purpose input/output (GPIO) function 210, which is coupled to a terminal SW of microcontroller 202. GPIO 210 includes both input circuitry for receiving and forwarding a digital logic level to terminal SW, and driver circuitry for driving a digital voltage level at terminal SW. As typical in the art, GPIO 210 is configured and operates under program control, as executed by processor 206. In this example, the digital logic levels driven at terminal SW by GPIO 210 in its form as an output are constituted by a power supply voltage $V_{pp}$ and ground ($V_{ss}$, or 0 volts). Of course, other digital output voltage levels may alternatively be output from GPIO 210, depending on the construction of the driver circuitry. In a preferred embodiment, GPIO 210 is so configured and operates to drive a square wave signal $V_{sq}$ at these two levels ($V_{pp}$, $V_{ss}$) that will serve as the stimulus applied to DUT 204, so as to facilitate a measure of its electrical impedance.

Processor 206 is also coupled to analog-to-digital converter (ADC) 212, which is in turn coupled (via conventional "analog front end" circuitry, not shown) to a terminal RS of microcontroller 202. ADC 212 operates to periodically sample and digitize the voltage $V_{out}$ at its terminal RS, producing a sample stream $V_{adc}$ that is forwarded to processor 206. In preferred embodiments, however, attention is also directed to a transfer function that can arise from any effects (e.g., gain, impedance) imposed by ADC 212 (and any related front end circuitry, not shown) on its input, relative to its output. Thus, for later reference, the following Equation 1 defines such a transfer function $H_{RX}$, in the receive ("RX") portion of the loop, as follows:

$$V_{adc} = H_{RX} V_{out} \qquad \text{Equation 1}$$

Thus, according to a preferred embodiment, the voltage sampled by ADC 212 represents the response of DUT 204 to the stimulus of square wave signal $V_{sq}$ applied from GPIO 210. Processor 206 in turn executes the appropriate program instructions, for example as stored in memory resource 208, to determine an impedance measurement for DUT 204 from those sampled voltages. According to preferred embodiments, processor 206 will determine that impedance measurement by performing a discrete Fourier transform (DFT) on the $V_{adc}$ sample stream acquired by ADC 212 from the response of DUT 204 to the applied stimulus.

As evident from this description, the stimulus applied to DUT 204 for the impedance measurement is not a sinusoid as in the conventional architecture of FIG. 1, but rather is a square wave signal $V_{sq}$ as generated by GPIO 210. Those skilled in the art will recognize that the use of a square wave will contain frequency components other than the single frequency of a sinusoid, which in this context will complicate the measurement of the electrical impedance of DUT 204. According to these embodiments, however, the generation of the square wave stimulus and the timing of the sampling of the response are based on the same clock signal at a relationship that accounts for lower harmonics of the fundamental square wave stimulus frequency.

Continuing with FIG. 2, a clock generator circuitry 214 of microcontroller 202 generates a relatively high-speed base clock signal CLK, at frequency $f_{CLK}$, on which both the square wave stimulus $V_{sq}$ and the sampling frequency $f_{ADC}$ applied by ADC 212 are based. In these embodiments, base clock frequency $f_{CLK}$ will be at a higher frequency than either the square wave stimulus frequency $f_{sq}$ or the sampling frequency $f_{ADC}$. As such, the stimulus and sampling frequencies can be generated within microcontroller 202 by relatively simple frequency divider functions, without requiring expensive and complex circuitry such as fractional phase-locked loops and the like as conventionally used to generate sinusoids at specific frequencies. On the stimulus side, base clock signal CLK is applied to digital timers 216 associated with GPIO 210, which divide down the frequency $f_{CLK}$ by an integer divisor to derive the timing of the square wave stimulus. For example, digital timers 216 may include a digital counter that issues a control signal to GPIO 210 to begin a cycle of the square wave (e.g., issue a rising edge) upon the elapsing of a specified number of cycles of clock signal CLK. A second digital counter also may be included within digital timers 216 to define the duty cycle of the square wave stimulus, for example by controlling GPIO 210 to end a pulse (e.g., issue a rising edge) upon the elapsing of a specified number of cycles of clock signal CLK. As such, both the period of the square wave stimulus and its duty cycle are derived as an integer number of cycles of clock signal CLK, according to this embodiment.

Similarly, a digital timer 218 is provided in microcontroller 202 to control the sampling frequency $f_{ADC}$ at which ADC 212 samples the response voltage at its corresponding terminal. In this embodiment, digital timer 218 controls ADC 212 to sample and digitize the response voltage upon the elapsing of a specified number of cycles of base clock signal CLK. As such, sampling frequency $f_{ADC}$ is divided down, by a selected integer divisor value, from the frequency $f_{CLK}$ of base clock signal CLK. The relationship of this integer value that defines sampling frequency $f_{ADC}$ and the integer value that defines square wave stimulus frequency $f_{sq}$ according to these embodiments is described in the above-incorporated U.S. patent application Ser. No. 15/344,565.

In the architecture of FIG. 2, terminal SW driven by GPIO 210 is coupled to an anti-aliasing filter 220, which is constructed to attenuate higher harmonics of the fundamental frequency of square wave stimulus $V_{sq}$. Filter 220 may be a conventional off-chip (i.e., outside of microcontroller 202) analog low-pass filter of the desired frequency response. For example, filter 220 may be constructed as a conventional $4^{th}$ order multiple feedback low-pass filter, or alternatively as any one of a number of filter architectures and topologies to attain the desired characteristic. Anti-aliasing filter 220 alternatively may be constructed as a band-pass frequency selective frequency filter, rather than a low-pass filter, if desired. If desired, anti-aliasing filter 220 may have a gain less than 1 in order to reduce the peak-to-peak voltage swing of the square wave stimulus as applied to DUT 204, to prevent signal saturation. In any case, anti-aliasing filter 220 is provided to minimize the effect of higher harmonics of the square wave stimulus, so that these harmonics do not significantly contaminate the measured response of DUT 204 at the fundamental frequency of that stimulus waveform. Moreover, in connection with preferred embodiment, attention is also directed to a transfer function that can arise from any effects (e.g., gain, impedance) imposed by filter 220 on its input, relative to its output. Thus, for later reference, the following Equation 2 defines such a transfer function $H_{TX}$, in the transmit ("TX") portion of the loop, as follows:

$$V_{in} = H_{TX} V_{sq} \quad \text{Equation 2}$$

where, $V_{in}$ is the voltage connected to a first terminal of DUT 204, so that DUT 204 is connected to receive $V_{in}$, which is the filtered square wave stimulus $V_{sq}$.

While not shown in FIG. 2, in a preferred embodiment, DUT 204 is switchably connected in and out of the loop shown in FIG. 2, so as to achieve preferred embodiment calibration techniques, detailed later.

An inverting amplifier circuit receives and amplifies the response of DUT 204 to the stimulus from GPIO 210 according to a preferred embodiment. As shown in FIG. 2, DUT 204 (or calibration impedances, as detailed later) is connected to an inverting input of differential operational amplifier ("op amp") 222. The non-inverting input of op amp 222 receives a DC voltage equal to the expected DC voltage of the square wave signal; in this example, a voltage source 224 applies a voltage of one-half the peak-to-peak amplitude of the square wave stimulus $V_{sq}$, for example one-half the supply voltage ($V_{pp}/2$). The output of op amp 222 is coupled to terminal RS of microcontroller 202, and thus to ADC 212 (via front end circuitry within microcontroller 202, not shown). A reference impedance 226 is connected between the output and the inverting input of op amp 222, in the well-known negative feedback manner. Reference impedance 226 is preferably a precision resistor or variable impedance (e.g., a bank of precision resistors in combination with switches for selectably switching one or more of the resistors into the circuit), and thus has a known impedance for purposes of this impedance measurement.

As will be evident later, preferred embodiments improve upon the prior art, as well as the partial diagram shown in FIG. 2, particularly at higher frequencies (e.g., above 100 kHz), by proposing and implementing additional calibration structure and methodology so as to overcome the non-idealities that arise at such frequencies, and that also may arise from other impedances in an impedance analyzing op-amp based circuit. Indeed, the preferred embodiments implement an architecture based on proposed modeling, wherein such architecture is based on the arguably surprising proposition that certain elements are reducible to a voltage division based model, wherein the voltage division accounts for various changes in impedance and op amp gain (i.e., op am impairments) over a wide range of high frequencies. To further appreciate such aspects, it was contemplated in connection with preferred embodiments that certain analyses proposed by the inventor could substantiate a model, and then the model is implemented in a preferred embodiment architecture. Thus, the following first proceeds with a discussion of those analyses, followed by preferred embodiment implementation from the findings.

Figure 3:
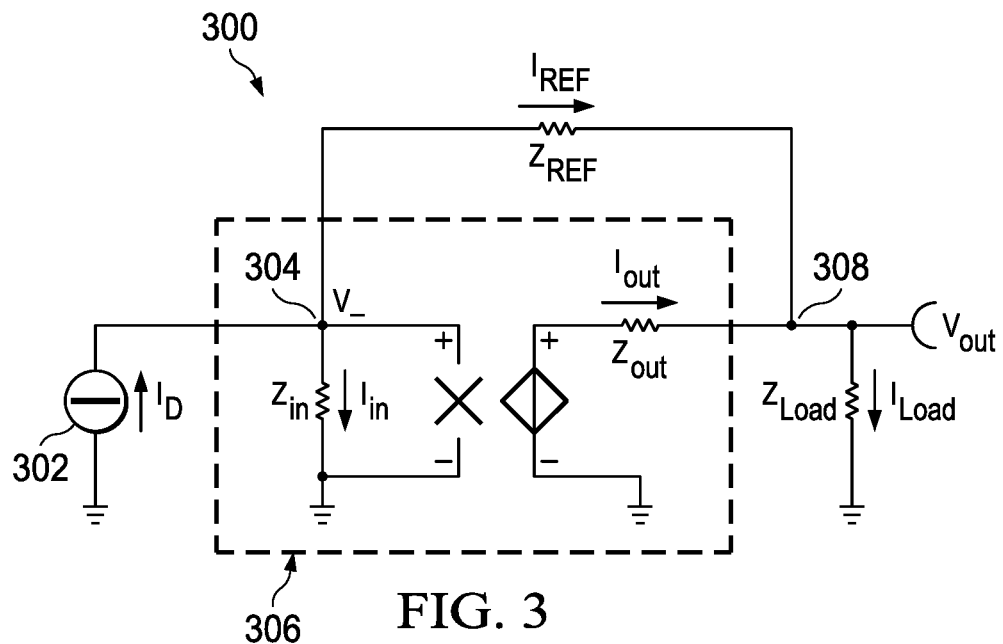
FIG. 3 illustrates a schematic of a proposed circuit model for establishing a relationship, so as to include and consider circuit non-idealities, between the current $I_D$ through a DUT and the voltage across an impedance analyzer load $Z_{Load}$.

In connection with improving the prior art of FIG. 1, as well as analyzer 200 of FIG. 2, FIG. 3 illustrates a schematic of a proposed circuit model 300 for establishing a relationship between the current $I_D$ through an impedance analyzer connected DUT and the voltage across a load $Z_{Load}$, which may represent the input impedance of an ADC (and related circuitry) of that analyzer. The model, therefore, proposes a transfer function as between that current and voltage, where as demonstrated later this transfer function in view of additional observations lends to a preferred embodiment that provides improved performance given the non-ideal performance of the prior art in high frequencies. Model 300 includes a current source 302 representing the current $I_D$ through the DUT, which is a result of the input voltage $V_{in}$ coupled to the DUT. Current $I_D$ connects to a node 304, which represents an inverting input to an op amp model 306 (i.e., a voltage-controlled voltage source). Thus, the voltage at node 304 is hereafter identified as $V_-$. Node 304 connects through an input impedance $Z_{in}$ to ground, through a reference impedance $Z_{REF}$ (e.g., akin to reference impedance 226 in FIG. 2) to a node 308, and through a gain coupling, which is shown with conventional representations and depicting the gain relationship such that the output of op amp model 306 is its gain, G, times its input (hence the voltage at the terminal of $Z_{out}$ connected to the voltage-controlled voltage source in FIG. 3 is given by $-GV_-$). Further in this regard, therefore, the gain coupling of op amp model 306 includes an output impedance $Z_{out}$, also connected to node 308. Node 308 is connected through load impedance $Z_{Load}$, to ground.

Given model 300, the current at node 304 may be expressed according to the following Equation 3:

$$I_D = I_{in} + I_{REF} \quad \text{Equation 3}$$

where, $I_{in}$ is the current through input impedance $Z_{in}$; and
$I_{REF}$ is the current through impedance $Z_{REF}$.

Each of the currents in Equation 3 may be re-written as the voltage drop across the respective impedance divided by that respective impedance, yielding the following Equation 4:

$$I_D = \frac{V_-}{V_{in}} + \frac{V_- - V_{out}}{Z_{REF}} \quad \text{Equation 4}$$

Re-arranging Equation 4 gives the following Equation 5:

$$I_D = V_- \left( \frac{1}{Z_{in}} + \frac{1}{Z_{REF}} \right) - \frac{V_{out}}{Z_{REF}} \quad \text{Equation 5}$$

Equation 5 may be re-written in terms of a factored out value of $V_{out}$, and given the parallel nature of the added reciprocal impedances in Equation 5, as in the following Equation 6:

$$I_D = V_{out}\left(\frac{(V_-/V_{out})}{(Z_{in} \| Z_{REF})} - \frac{1}{Z_{REF}}\right) \quad \text{Equation 6}$$

Next, the numerator term of $(V_-/V_{out})$ in Equation 6 may be further analyzed in view of the output side of model 300. In this regard, the current at node 308 may be expressed according to the following Equation 7:

$$I_{REF} + I_{out} = I_{Load} \quad \text{Equation 7}$$

where, $I_{Load}$ is the current through the load impedance $Z_{Load}$. Each of the currents in Equation 7 may be re-written as the voltage drop across the respective impedance divided by that respective impedance, yielding following Equation 8:

$$\frac{V_- - V_{out}}{Z_{REF}} + \frac{-GV_- - V_{out}}{Z_{out}} = \frac{V_{out}}{Z_{Load}} \quad \text{Equation 8}$$

Next, providing a common denominator to the left of Equation 8 yields the following Equation 9:

$$\frac{(V_- * Z_{out}) - (V_{out} * Z_{out}) - (GV_- * Z_{REF}) - (V_{out} * Z_{REF})}{Z_{REF} Z_{out}} = \frac{V_{out}}{Z_{Load}} \quad \text{Equation 9}$$

Grouping common term, $V_-$ and $V_{out}$, from the left of Equation 9 yields the following Equation 10:

$$\frac{(V_- * Z_{out}) - (GV_- * Z_{REF})}{Z_{REF} Z_{out}} - \frac{(V_{out} * Z_{out}) + (V_{out} * Z_{REF})}{Z_{REF} Z_{out}} = \frac{V_{out}}{Z_{Load}} \quad \text{Equation 10}$$

Equation 10 simplifies as shown in the following Equation 11:

$$\frac{V_-(Z_{out} - (GZ_{REF}))}{Z_{REF} Z_{out}} - \frac{V_{out}(Z_{out} + Z_{REF})}{Z_{REF} Z_{out}} = \frac{V_{out}}{Z_{Load}} \quad \text{Equation 11}$$

Moving the factor of $V_{out}$ from the left of Equation 11 to the right and factoring further yields the following Equation 12:

$$V_-\left(\frac{1}{Z_{REF}} - \frac{G}{Z_{out}}\right) = \frac{V_{out}}{Z_{Load}} + \frac{V_{out} Z_{out}}{Z_{REF} Z_{OUT}} + \frac{V_{out} Z_{REF}}{Z_{REF} Z_{OUT}} \quad \text{Equation 12}$$

Lastly, providing a common denominator to the right side of Equation 12 and then factoring, yields the following Equation 13:

$$V_-\left(\frac{1}{Z_{REF}} - \frac{G}{Z_{out}}\right) = V_{out}\left(\frac{1}{Z_{Load}} + \frac{1}{Z_{out}} + \frac{1}{Z_{REF}}\right) \quad \text{Equation 13}$$

Dividing both sides to get a ratio of the node 304 voltage to the node 308 voltage (i.e., $(V_-/V_{out})$) yields the following Equation 14, where combined impedance reciprocals are re-stated as parallel connections, as known in the art:

$$V_-/V_{out} = \frac{(Z_{REF} \| -Z_{out}/G)}{(Z_{REF} \| Z_{out} \| Z_{Load})} \quad \text{Equation 14}$$

Next, the result of Equation 14 can be substituted into the numerator term of $(V_-/V_{out})$ in Equation 6, providing the following Equation 15:

$$\frac{I_D}{V_{out}} = \quad \text{Equation 15}$$

$$\frac{-1}{Z_{REF}}\left(1 - \left(1 + \frac{Z_{REF}}{Z_{out}} + \frac{Z_{REF}}{Z_{Load}}\right)\left(\frac{1 + Z_{REF}/Z_{in}}{1 - GZ_{REF}/Z_{out}}\right)\right) = \frac{-Q}{Z_{REF}}$$

where, in Equation 15, the factors other than the impedance $Z_{REF}$ are combined into a single factor, Q, representing a transfer function that accounts for the scaling factor on current that arises from the other impedances shown in Equation 15, as well as from any change in the gain –G of op amp 306. In other words, for simplicity, Equation 15 can be re-written as the following Equation 16:

$$V_{out} = I_D\left(\frac{Z_{REF}}{-Q}\right) \quad \text{Equation 16}$$

Thus, Equation 16 readily demonstrates how $I_D$ is scaled by the factor of $$\left(\frac{Z_{REF}}{-Q}\right)$$

so as to influence the op amp output voltage $V_{out}$, and independent of the DUT impedance.

Figure 4:
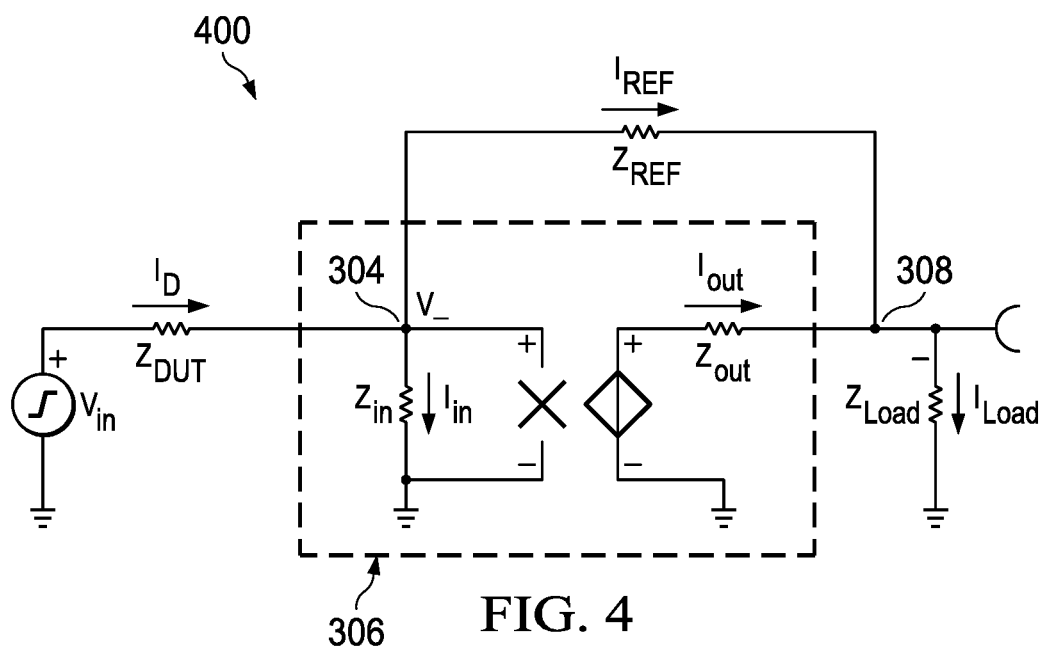
FIG. 4 illustrates a schematic of a proposed circuit model for establishing a relationship, so as to include and consider circuit non-idealities, between an input voltage to an impedance analyzer and the voltage dropped across a DUT.

Having established a model and observations of impact on current $I_D$ by certain impedances and op amp gain, even under non-ideal circumstances, the present inventor further now expands the model 300 of FIG. 3, so as to include the DUT impedance, and therefore to further observe output behavior in response to the input voltage; in other words, ideally all input source voltage would be dropped across the DUT, but in actuality the non-idealities cause some of the input voltage to be dropped elsewhere, and hence the following separates the former from the latter. Thus, FIG. 4 illustrates a schematic of a proposed circuit model 400 for establishing a relationship, so as to include and consider circuit non-idealities, between an input voltage to an impedance analyzer and the voltage dropped across a DUT. More particularly, therefore, FIG. 4 illustrates model 400, which is model 300 of FIG. 3, with the addition of the input voltage, $V_{in}$, such as from an anti-aliasing filter (see, e.g., FIG. 2, filter 220), and to include the impedance $Z_{DUT}$ of the DUT or, more appropriately, what will be the measured value of that impedance, hereafter referred to as $Z_{DUT}^{Meas}$. Note further with respect to the $Z_{DUT}^{Meas}$ that it can include other connection-related impedances—specifically, the impedance analyzer is typically on a circuit board, and the DUT may be connected to that impedance analyzer circuit board by a cable or some other connector. The measure of $Z_{DUT}^{Meas}$, therefore, includes the gain and phase shift caused by this connection. Indeed, in some instances, after certain measures are taken, such as those in accordance with the preferred embodiments described below (i.e., compensation for op amp impairments), there may be an additional calibration procedure to correct for the effect of these cables and connectors between the circuit board and the DUT. The second calibration procedure, going from $Z_{DUT}^{Meas}$ to an actual estimated impedance value for the DUT (i.e., $Z_{DUT}$), is well known. For example, the reader is referred to Appendix C of the reference, "*Impedance Measurement Handbook, A guide to measurement technology and techniques,*" $6^{th}$ Edition, by Keysight Technologies, which is hereby incorporated fully herein by reference. In any event, given model 400, the current at node 304 may be expressed according to the following Equation 17:

$$I_D = I_{REF} + I_{in} \qquad \text{Equation 17}$$

Each of the currents in Equation 17 may be re-written as the voltage drop across the respective impedance divided by that respective impedance, and here by representing current $I_D$ based on the measured impedance $Z_{DUT}^{Meas}$, yielding following Equation 18:

$$\frac{V_{in} - V_-}{Z_{DUT}^{Meas}} = \frac{V_- - V_{out}}{Z_{REF}} + \frac{V_-}{Z_{in}} \qquad \text{Equation 18}$$

Separating the left side term into two addends and moving the one relating to $V_-$ to the right of Equation 18 yields the following Equation 19:

$$\frac{V_{in}}{Z_{DUT}^{Meas}} = \frac{V_-}{Z_{REF}} + \frac{-V_{out}}{Z_{REF}} + \frac{V_-}{Z_{in}} + \frac{V_-}{Z_{DUT}^{Meas}} \qquad \text{Equation 19}$$

Factoring out the common term $V_-$ from the right of Equation 19 yields the following Equation 20:

$$\frac{V_{in}}{Z_{DUT}^{Meas}} = V_- \left( \frac{1}{Z_{REF}} + \frac{1}{Z_{in}} + \frac{1}{Z_{DUT}^{Meas}} \right) + \frac{-V_{out}}{Z_{REF}} \qquad \text{Equation 20}$$

Combing the right side terms having $Z_{REF}$ in the denominator of Equation 20 yields the following Equation 21:

$$\frac{V_{in}}{Z_{DUT}^{Meas}} = V_- \left( \frac{1}{Z_{REF}} \left( 1 - \frac{V_{out}}{V_-} \right) + \frac{1}{Z_{in}} + \frac{1}{Z_{DUT}^{Meas}} \right) \qquad \text{Equation 21}$$

Next, the reciprocal of Equation 14 can be substituted into the term $$\frac{V_{out}}{V_-}$$

of Equation 21, and the parallel impedances expanded, which yields the following Equation 22:

$$\frac{V_{in}}{Z_{DUT}^{Meas}} = V_- \left[ \left( \frac{1}{Z_{DUT}^{Meas}} + \frac{1}{Z_{REF}} + \frac{1}{Z_{in}} \right) - \qquad \text{Equation 22} \right.$$

$$\left. \left( \frac{1}{Z_{REF}} - \frac{G}{Z_{out}} \right) \left( 1 + \frac{Z_{REF}}{Z_{Load}} + \frac{Z_{REF}}{Z_{out}} \right) \right]$$

Next, the following Equation 24 can be observed from rearranging the terms in the equation to collect the voltage variables on the left hand side of the equals sign, and to collect the impedance variables on the right hand side:

$$\frac{V_-}{V_{in}} = \left( \frac{1}{Z_{DUT}^{Meas}} \right) \Big/ \left[ \left( \frac{1}{Z_{DUT}^{Meas}} + \frac{1}{Z_{REF}} + \frac{1}{Z_{in}} \right) - \qquad \text{Equation 23} \right.$$

$$\left. \left( \frac{1}{Z_{REF}} - \frac{G}{Z_{out}} \right) \left( 1 + \frac{Z_{REF}}{Z_{out}} + \frac{Z_{REF}}{Z_{Load}} \right) \right]$$

Next, the following Equation 24 can be observed from multiplying all the terms of the right hand side denominator by $Z_{DUT}^{Meas}$:

$$\frac{V_-}{V_{in}} = 1 \Big/ \left[ \left( 1 + \frac{Z_{DUT}^{Meas}}{Z_{REF}} + \frac{Z_{DUT}^{Meas}}{Z_{in}} \right) - \qquad \text{Equation 24} \right.$$

$$\left. \left( \frac{Z_{DUT}^{Meas}}{Z_{REF}} - \frac{G Z_{DUT}^{Meas}}{Z_{out}} \right) \left( 1 + \frac{Z_{REF}}{Z_{out}} + \frac{Z_{REF}}{Z_{Load}} \right) \right]$$

Given Equation 24, the equivalent of all factors in Equation 24, other than $Z_{DUT}^{Meas}$, can be represented by a collective admittance value P, in which case Equation 24 reduces to the following Equation 25:

$$\frac{V_-}{V_{in}} = \frac{1}{1 + P Z_{DUT}^{Meas}} \qquad \text{Equation 25}$$

Next, the relationship of the voltage drop across the DUT to the variables $V_{in}$ and $V_-$ also may be mathematically stated as in the following Equation 26:

$$V_{in} - V_- = V_{in} \left( 1 - \frac{V_-}{V_{in}} \right) \qquad \text{Equation 26}$$

Then, substituting the value from Equation 25 of $$V_{in} - V_- = V_{in} \left( 1 - \frac{1}{1 + P Z_{DUT}^{Meas}} \right) \qquad \text{Equation 27}$$

into the last term of Equation 26 yields the following Equation 27:

$$V_D = H_{TX} V_{sq} \left( 1 - \frac{1}{1 + P Z_{DUT}^{Meas}} \right) = H_{TX} V_{sq} \left( \frac{P Z_{DUT}^{Meas}}{1 + P Z_{DUT}^{Meas}} \right) \qquad \text{Equation 28}$$

Still further, the transfer function arising from the anti-aliasing filter from Equation 2 may be added to Equation 27, thereby providing the following Equation 28:

$$V_D = H_{TX}V_{sq}\left(1 - \frac{1}{1+PZ_{DUT}^{Meas}}\right) = H_{TX}V_{sq}\left(\frac{PZ_{DUT}^{Meas}}{1+PZ_{DUT}^{Meas}}\right) \quad \text{Equation 28}$$

Lastly in view of the above, and further given the receive transfer function of $H_{RX}$ of Equation 1, the relationship of $V_{sq}$ and $V_{adc}$ can be stated as in the following Equation 29:

$$\frac{V_{sq}}{V_{adc}} = \frac{V_D / \left(H_{TX}\frac{PZ_{DUT}^{Meas}}{1+PZ_{DUT}^{Meas}}\right)}{-H_{RX}(Z_{REF}/Q)I_D} = \quad \text{Equation 29}$$

$$\left(\frac{-Q}{Z_{REF}H_{TX}H_{RX}}\right)\left(1+\frac{1}{PZ_{DUT}^{Meas}}\right)\frac{V_D}{I_D} =$$

$$\left(\frac{-Q}{Z_{REF}H_{TX}H_{RX}}\right)\left(Z_{DUT}^{Meas}+\frac{1}{P}\right)$$

The present inventor proposes from the preceding, therefore, that Equation 29 demonstrates that with circuit non-idealities including op am impairments, the measured op amp output voltage $V_{adc}$ relates to the excitation voltage $V_{sq}$ in attempting to measure the DUT impedance by an impedance analyzer, by two factors, namely, an added offset $$\left(\text{i.e., }\frac{1}{P}\right)$$

and a multiplier $$\left(\text{i.e., }\left(\frac{-Q}{Z_{REF}H_{TX}H_{RX}}\right)\right).$$

The multiplier represents the transconductance of the amplifier 222 and reference impedance 226, corrected for the non-idealities of the circuit elements. The offset models the degradation of the op amp virtual ground by impedance in series with the DUT. The full voltage swing of $V_{sq}$ drops across the voltage divider formed by the DUT and the offset impedance. Hence, there are two unknowns in this relationship, giving rise to a preferred embodiment impedance analyzer 500, which is now explored.

Figure 5:
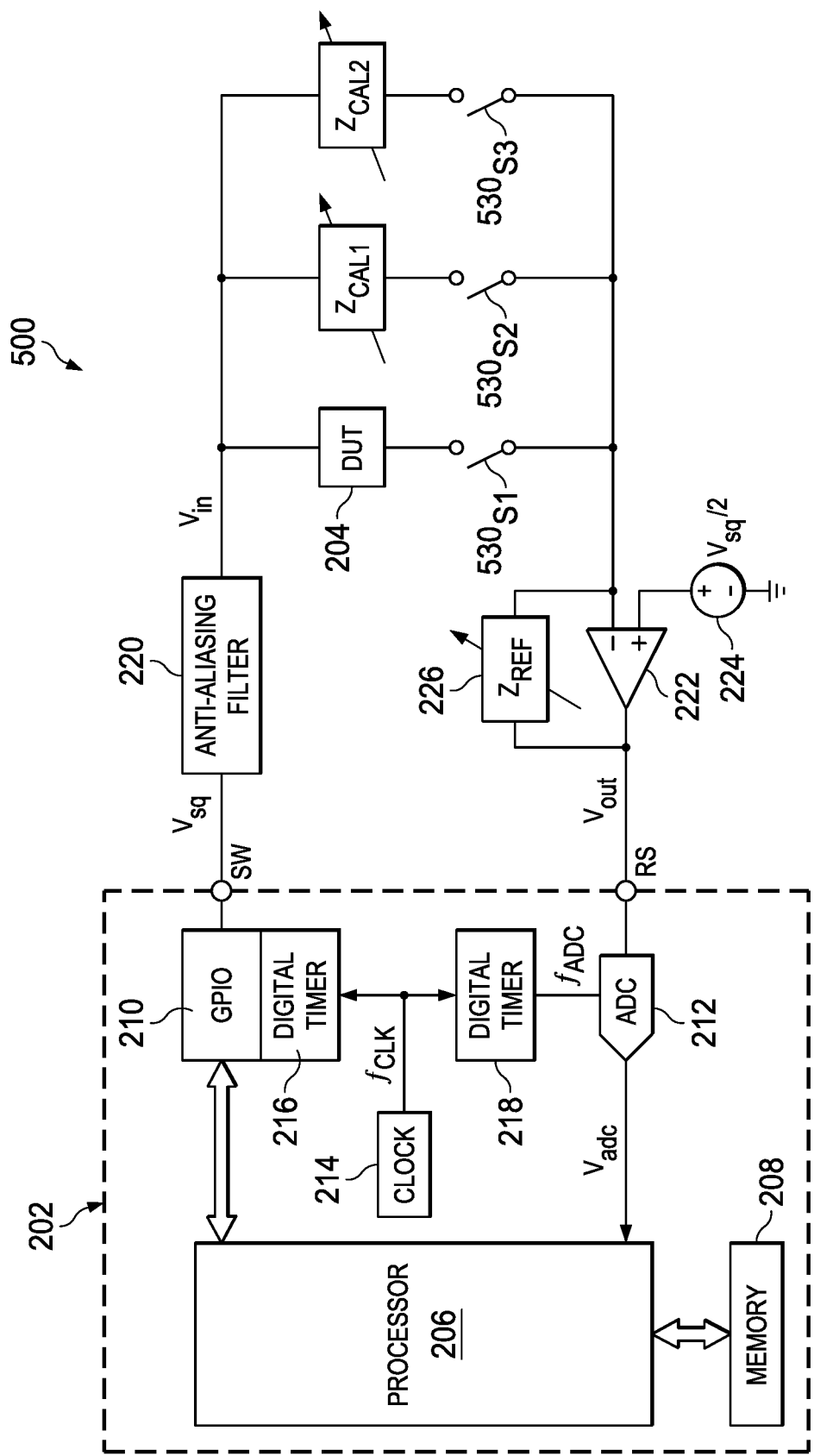
FIG. 5 illustrates a schematic of a preferred embodiment impedance analyzer, which is preferably a microcontroller-based impedance analyzer constructed according to a preferred embodiment.

FIG. 5 illustrates a schematic of a preferred embodiment impedance analyzer 500, which is preferably the microcontroller-based impedance analyzer 200 of FIG. 2, but now constructed according to a preferred embodiment to include various calibration aspects, as introduced earlier and as now should be better understood with reference to the preceding teachings from the present inventor. Thus, in general, analyzer 500 includes all the aspects illustrated above in connection with FIG. 2, and the reader is assumed to be familiar with that illustration and the accompanying details provided earlier. Thus, the following discussion attends to the additional aspects.

In a preferred embodiment, analyzer 500 includes a switching block 530 with three switches, shown as 530$_{S1}$, 530$_{S2}$, and 530$_{S3}$, each connected for selecting a respective load at a time and including it in the analyzer 500 loop. Further in this regard, therefore, switches 530$_{S1}$, 530$_{S2}$, and 530$_{S3}$ may be under control of microcontroller 202 or some intermediary control block so as to close one switch at a time, leaving the other two open, and in a desired order so as to accomplish functionality and unknown parameter determination as detailed later. Looking more particularly to the connectivity, DUT 204 is connected to a first terminal of a first switch 530$_{S1}$, a first calibration impedance $Z_{CAL1}$ is connected to a first terminal of a second switch 530$_{S2}$, and a second calibration impedance $Z_{CAL2}$ is connected to a first terminal of a third switch 530$_{S3}$; the second terminals of each of switches 530$_{S1}$, 530$_{S2}$, and 530$_{S3}$ is connected to the inverting input of op amp 222. Thus, switches 530 are operated to select one of three loads at a time as an input to the inverting input of op amp 222, whereby, therefore, in one instance calibration impedance $Z_{CAL1}$ may be so selected, so as to perform one calibration operation given that calibration impedance $Z_{CAL1}$ is a known precision impedance, and in another instance calibration impedance $Z_{CAL2}$ may be so selected, so as to perform another calibration operation given that calibration impedance $Z_{CAL2}$ is also a known precision impedance, while lastly DUT 204 may be selected and, as discussed below, the results from the two calibrations, involving calibration impedances $Z_{CAL1}$ and $Z_{CAL2}$, may be used to provide values for adjusting the measured voltage $V_{out}$ so as to arrive at an estimated value of the impedance of DUT 204 (i.e., finding $Z_{DUT}^{Meas}$).

Having introduced analyzer 500 and described the connections therein, note now that Equation 29 may be simplified as shown in the following Equation 30:

$$\frac{V_{sq}}{V_{adc}} = H_{TOT}\left(Z_{DUT}^{Meas}+\frac{1}{P}\right) \quad \text{Equation 30}$$

where, $H_{TOT}$ is a total transform function, thereby singularly representing the product of four unknowns, $$\left(\frac{-Q}{Z_{REF}H_{TX}H_{RX}}\right).$$

Thus, by collecting the various factors into $H_{TOT}$, it may now be appreciated that Equation 30 (and Equation 29), represents for a given measurement cycle by analyzer 500 a total of two unknowns, one being the multiplier $H_{TOT}$, and the other being the offset $$\frac{1}{P}.$$

Inasmuch as analyzer 500 includes two different selectable, and known, calibration impedances, then in a preferred embodiment analyzer 500 is operated in one iteration wherein switch 530$_{S2}$ is exclusively closed, for a given $V_{sq}$ at a given frequency, and since $Z_{CAL1}$ is known, then Equation 31 becomes as shown in the following Equation 30.1.

$$\frac{V_{sq}}{V_{adc1}} = H_{TOT}\left(Z_{CAL1}+\frac{1}{P}\right) \quad \text{Equation 30.1}$$

Similarly, analyzer 500 is operated in another iteration wherein switch 530$_{S3}$ is exclusively closed, for a given $V_{sq}$ at a given frequency, and since $Z_{CAL2}$ is known, then Equation 31 becomes as shown in the following Equation 30.2.

$$\frac{V_{sq}}{V_{adc2}} = H_{TOT}\left(Z_{CAL2} + \frac{1}{P}\right) \qquad \text{Equation 30.2}$$

Hence, from the two iterations, and for the given frequency, then the results will be two sets of results for two different unknowns, those being the multiplier $H_{TOT}$ and $$\frac{1}{P},$$

as the other items shown in Equations 30.1 and 30.2 will be known (either at the outset (i.e., $V_{sq}$ and $Z_{CAL1}$ or $Z_{CAL2}$) or as measured (i.e., $V_{adc1}$ for the measure when switching in $Z_{CAL1}$ and $V_{adc2}$ for the measure when switching in $Z_{CAL2}$)). With two equations and two unknowns, one skilled in the art may readily solve for the unknowns.

Given the preceding, preferably the same two iterations for determining multiplier $H_{TOT}$ and offset $$\frac{1}{P}$$

are repeated for respective other frequencies. Thus, an entire set of values may be stored (e.g., table in memory) wherein, for each frequency, a value of multiplier $H_{TOT}$ and offset $$\frac{1}{P},$$

determined from a paired iteration at the respective frequency, are stored. Thereafter, analyzer 500 is readily operable to determine the impedance of DUT 204, at any of the frequencies for which those values were stored. More particularly, when such an impedance measure is desired, switch 530$_{S1}$ is exclusively closed and $V_{adc}$ is measured at a particular frequency. From that measure, and from the already-determined values of $H_{TOT}$ and $$\frac{1}{P},$$

then Equation 30 may be re-arranged to show the ready application of those values to the rest of the Equation, so as to arrive at the impedance of DUT 204, as shown in the following Equation 31:

$$\frac{V_{sq}}{V_{adc}H_{TOT}} - \frac{1}{P} = Z_{DUT}^{Meas} \qquad \text{Equation 31}$$

From Equation 31, therefore, microcontroller 202 can control switch 530$_{S1}$ to close and issue, via GPIO 210 a stimulus signal $V_{sq}$, while then measuring the response $V_{adc}$ with the additional scaling of $H_{TOT}$ and offset of $$\frac{1}{P},$$

microcontroller 202 can thereby apply those various values, per Equation 31, so as to provide a measure of impedance for the DUT.

From the above, various preferred embodiments provide improvements to measuring impedance of a circuit element, as providing plural calibration steps so as to as compensate for non-idealities in an analyzer loop that includes an operational amplifier. Various benefits have been described and others will be discernable to one skilled in the art. Indeed, while FIG. 5 illustrates the two switchable calibration elements in an analyzer that uses a non-sinusoid stimulus, an alternative contemplated preferred embodiment would apply such two switchable calibration elements in an analyzer that resembles that of FIG. 1, that is, where the sinusoid is a driving stimulus signal to the DUT. In this regard, therefore, no anti-aliasing filter would be involved and, hence, the value $H_{TX}$ may be removed (i.e., considered a value of one), while in this alternative there would still be a value of $H_{RX}$ due to the ADC (and its front end). In all events, also noted is that testing of preferred embodiments have shown a marked performance benefit over the prior art where, for example a prior art approach may have incurred a marked performance degradation at frequencies of approximately 300 kHz, the preferred embodiment shows improved performance, using a same op amp but with the additional aspects described above, at frequencies approximating 1 MHz or beyond. Accordingly, while various aspects have been provided according to the disclosed embodiments, still others are contemplated and yet others may be ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A circuit, comprising:
   stimulus circuitry having a stimulus output, the stimulus circuitry configured to generate a stimulus wave at the stimulus output;
   an amplifier circuit having an amplifier input and an amplifier output;
   switching circuitry coupled between the stimulus output and the amplifier input, the switching circuitry adapted to be coupled to a device under test (DUT), the switching circuitry adapted to be coupled to a first calibration impedance device, the switching circuitry adapted to be coupled to a second calibration impedance device, and the switching circuitry configured to selectively couple, between the stimulus output and the amplifier input, either the DUT, the first calibration impedance device or the second calibration impedance device; and
   processor circuitry coupled to the amplifier output, the processor circuitry configured to:
      sample a first signal from the amplifier output when the switching circuitry couples the first calibration impedance device between the stimulus output and the amplifier input;
      sample a second signal from the amplifier output when the switching circuitry couples the second calibration impedance device between the stimulus output and the amplifier input;
      sample a third signal from the amplifier output when the switching circuitry couples the DUT between the stimulus output and the amplifier input, the third signal representing a response of the DUT to the stimulus wave; and in response to the first, second and third signals, provide a measure of impedance of the DUT.

2. The circuit of claim 1, further comprising an analog-to-digital converter (ADC) through which the processor circuitry is coupled to the amplifier output, the ADC having an ADC input and an ADC output, the ADC input coupled to the amplifier output, and the ADC configured to: sample analog versions of the first, second and third signals from the amplifier output; and generate digital versions of the first, second and third signals at the ADC output, which is coupled to the processor circuitry.

3. The circuit of claim 1, wherein the processor circuitry is coupled to the switching circuitry and configured to control the switching circuitry.

4. The circuit of claim 1, wherein the processor circuitry is configured to provide the measure of impedance of the DUT in response to a multiplier and an offset determined from the first and second signals.

5. The circuit of claim 1, wherein the processor circuitry is configured to provide the measure of impedance of the DUT in response to a multiplier determined from the first and second signals.

6. The circuit of claim 1, wherein the processor circuitry is configured to provide the measure of impedance of the DUT in response to an offset determined from the first and second signals.

7. The circuit of claim 1, wherein the stimulus wave comprises a sinusoidal stimulus wave.

8. The circuit of claim 1, wherein the stimulus wave comprises a non-sinusoidal stimulus wave.

9. The circuit of claim 1, wherein the stimulus wave comprises a square stimulus wave.

10. The circuit of claim 9, further comprising an anti-aliasing filter coupled between the stimulus output and the switching circuitry.

11. The circuit of claim 4:
wherein the multiplier comprises a representation of a transconductance of the amplifier circuit and a reference impedance; and
wherein the offset comprises a model of degradation of a virtual ground of the amplifier circuit.

12. A method, comprising:
generating a stimulus wave at a stimulus output;
selectively coupling, between the stimulus output and an amplifier input of an amplifier, either a device under test (DUT), a first calibration impedance device or a second calibration impedance device;
sampling a first signal from an amplifier output of the amplifier when the first calibration impedance device is coupled between the stimulus output and the amplifier input;
sampling a second signal from the amplifier output when the second calibration impedance device is coupled between the stimulus output and the amplifier input;
sampling a third signal from the amplifier output when the DUT is coupled between the stimulus output and the amplifier input, the third signal representing a response of the DUT to the stimulus wave; and
in response to the first, second and third signals, providing a measure of impedance of the DUT.

13. The method of claim 12, wherein providing the measure of impedance of the DUT is responsive to a multiplier and an offset determined from the first and second signals.

14. The method of claim 12, wherein providing the measure of impedance of the DUT is responsive to a multiplier determined from the first and second signals.

15. The method of claim 12, wherein providing the measure of impedance of the DUT is responsive to an offset determined from the first and second signals.

16. The method of claim 12, wherein the stimulus wave comprises a sinusoidal stimulus wave.

17. The method of claim 12, wherein the stimulus wave comprises a non-sinusoidal stimulus wave.

18. The method of claim 12, wherein the stimulus wave comprises a square stimulus wave.

* * * * *